(12) United States Patent
Kawasumi

(10) Patent No.: US 7,170,312 B2
(45) Date of Patent: Jan. 30, 2007

(54) SYSTEMS AND METHODS FOR REDUCING TIMING VARIATIONS BY ADJUSTING BUFFER DRIVABILITY

(75) Inventor: Atsushi Kawasumi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 11/017,265

(22) Filed: Dec. 20, 2004

(65) Prior Publication Data

US 2006/0132184 A1 Jun. 22, 2006

(51) Int. Cl.
*H03K 17/16* (2006.01)

(52) U.S. Cl. ............................ 326/21; 326/22; 326/26; 326/82

(58) Field of Classification Search ............ 326/26–27, 326/30, 87, 21–23, 82–83; 327/108–112
See application file for complete search history.

(56) References Cited

U.S. PATENT DOCUMENTS 6,466,486 B2   10/2002   Kawasumi
6,803,790 B2 * 10/2004   Haycock et al. .............. 326/82
6,922,079 B1 * 7/2005    Drapkin et al. ................ 326/83

OTHER PUBLICATIONS

Chadrakasan et al; "Design of High-Performance Microprocessor Circuits"; Problems and Solutions Regarding Capacitance; pp. 359-364; vol. 17.3, 2001 no month.

* cited by examiner

*Primary Examiner*—Anh Q. Tran
(74) *Attorney, Agent, or Firm*—Law Offices of Mark L. Berrier

(57) ABSTRACT

Systems and methods for reducing variations in the timing of signal transitions which may result from interference with neighboring signal lines by adjusting the drivability of in-line buffers based upon the hostile/friendly condition of the neighboring lines. In one embodiment, a first inverter includes selectable current paths between the buffer output and Vdd/ground. A higher current is selected for one path and a lower current is selected for the other path so that the buffer output will be pulled more strongly in the direction (Vdd/ground) to which the neighboring signals may be hostile. In one embodiment, each selectable current path includes a plurality of parallel transistors, one of which is always switched on and the others of which are switched on or off according to the friendly/hostile states of the neighboring signals.

20 Claims, 10 Drawing Sheets

SYSTEMS AND METHODS FOR REDUCING TIMING VARIATIONS BY ADJUSTING BUFFER DRIVABILITY

BACKGROUND

1. Field of the Invention

The invention relates generally to electronic circuits, and more particularly to systems and methods for reducing timing variations of signals that result from coupling capacitance between signal lines.

2. Related Art

With advancements in computer-related technologies, there is constantly a demand for faster and smaller devices. In order to make these devices smaller and faster, it is necessary to make the components that form the devices physically smaller. Decreasing the size of these components, however, can result in problems that prevent the devices from operating more quickly, and may even cause the devices to malfunction.

As the size of electronic components decreases, the size and spacing (pitch) of the wires connecting these components also decreases. As the pitch of the wires in an electrical circuit decreases, the coupling capacitance of these wires increases. The increased coupling capacitance in turn results in increased interference between the wires. Interference between signals on adjacent wires can cause signal transitions to occur more quickly or more slowly, depending upon the particular signals on each of the wires.

The time-varying signals carried on a wire in a computer or other digital device represent binary values (i.e., a 0 or a 1.) In order to interpret the sequence of binary values represented by the time-varying signal on a particular wire, it is important to know the timing of the signal. In other words, it is important to know when the signal may be transitioning between values, and when the signal is stable and can be interpreted as either a 0 or a 1. When the time required for the signal to make transitions between values changes because of interference between signals on adjacent wires, the timing constraints on the signal must be relaxed in order to ensure that the signal is not too close to a transition when it is being interpreted as a binary value.

Binary signal lines often have in-line buffers (e.g., inverters) to strengthen the corresponding signals as they traverse the length of the lines. Conventional devices sometimes attempt to minimize the interference between adjacent signal lines by providing multiple in-line inverters in each of the signal lines, and staggering the positions of the inverters. As a result, over the length of a segment of a particular signal line, the neighboring signal lines have one value for half of the length, and the opposite value for the other half of the length. This is illustrated in FIG. 1.

Referring to FIG. 1, portions of three adjacent signal lines are shown. Each of lines 110, 120 and 130 has a pair of inverters. (Each line may include other inverters, but these are not shown for purposes of clarity.) It can be seen that the inverters in each line are positioned halfway between the inverters of the adjacent lines. As a result, the transitions on adjacent lines are also staggered and therefore cause less interference between adjacent lines and less variations in signal timing.

This conventional solution, however, may have several problems. For example, this solution involves the use of more inverters than are typically necessary simply to drive the signals on the respective lines. Because additional components are necessary, additional space is required in order to provide these components. Providing this additional space may be difficult and/or expensive. Further, because different signal lines may have different lengths, this solution may result in different loads on the signal lines. This results in even greater variations in the effective lengths of the signal paths which causes additional timing problems.

It would therefore be desirable to provide systems and methods for reducing interference between signal lines which causes variations in the timing of signal transitions, without incurring the problems associated with conventional solutions.

SUMMARY OF THE INVENTION

One or more of the problems outlined above may be solved by the various embodiments of the invention. Broadly speaking, the invention includes systems and methods for reducing variations in the timing of signal transitions which may result from interference with neighboring signal lines by adjusting the drivability of in-line buffers based upon the hostile/friendly condition of the neighboring lines. In one embodiment, a first inverter in one signal line is cross-coupled with adjacent signal lines so that, when signals on the adjacent signal lines are friendly, the drivability of the first inverter is not affected, but when signals on the adjacent lines are hostile, the drivability of the first inverter is increased.

One embodiment comprises a buffer including a signal input, a signal output, and a control input, where the buffer is configured to selectively adjust the buffer's drivability in response to receiving a control signal at the control input. In one embodiment, the control input is coupled to a neighboring signal line, so that the signal on the neighboring line serves as the control signal. If the neighboring signal is the same as the signal input to the buffer, the neighboring signal will be either friendly or quiet, so the buffer is set to a lower (normal) drivability. If the neighboring signal is the opposite of the signal input to the buffer, the neighboring signal will be either hostile or quiet, so the buffer is set to a higher drivability. In one embodiment, the level of drivability is set by enabling increased current flow either to or from the signal output of the buffer and will therefore provide greater drivability for signal transitions in one direction (e.g., high to low) than the other (e.g., low to high).

An alternative embodiment comprises a system that includes a first signal line having a buffer and one or more additional signal lines. The buffer has one or more control inputs, where each of the one or more control inputs is coupled to a corresponding one of the additional signal lines. The buffer is configured to selectively adjust its drivability in response to receiving the signals of the additional signal lines at its control inputs. If the buffer is coupled to one additional signal line, the drivability of the buffer is adjusted based on potentially friendly or hostile transitions on the additional signal line. If the buffer is coupled to multiple additional signal lines, the drivability of the buffer is adjusted based on potentially friendly or hostile transitions on each of the additional signal lines. In one embodiment, each of the additional signal lines has an identical buffer, and each buffer is coupled to receive the signals of the neighboring lines and configured to adjust its drivability based on the potentially friendly or hostile transitions on the neighboring lines.

Another alternative embodiment comprises a method that includes providing a buffer in a first signal line, where the buffer has adjustable drivability, and adjusting the drivability of the buffer in response to whether signals on one or more neighboring signal lines are potentially hostile or potentially friendly to signal transitions on the first signal line. In one embodiment, the drivability of the buffer is adjusted by selectively enabling more or less current to flow through a set of pull-up and/or pull-down transistors in the buffer. The method thereby makes the buffer more drivable when the signals on neighboring signal lines are hostile to transitions on the first signal line, and less drivable when the signals on neighboring signal lines are friendly to transitions on the first signal line.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
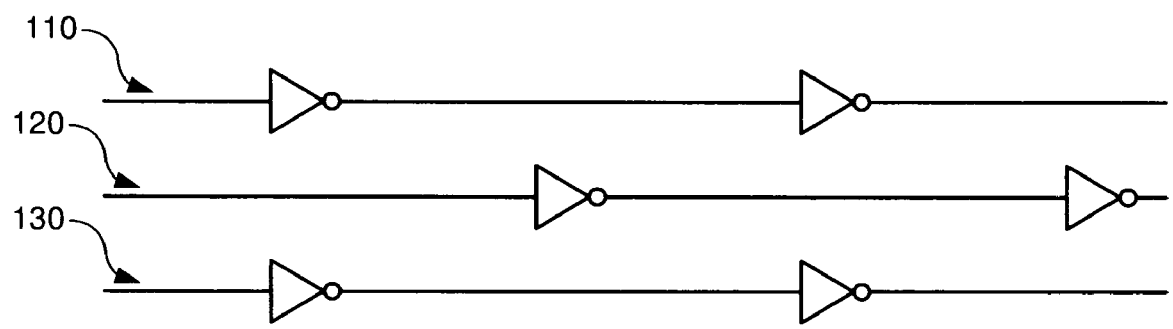
FIG. 1 is a diagram illustrating portions of three adjacent signal lines that use staggered buffers in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for for reducing variations in the timing of signal transitions which may result from interference with neighboring signal lines by adjusting the drivability of in-line buffers based upon the hostile/friendly condition of the neighboring lines. In one embodiment, an inverter in one signal line is cross-coupled with adjacent signal lines so that, when signals on the adjacent signal lines are friendly, the drivability of the inverter is not affected, but when signals on the adjacent lines are hostile, the drivability of the inverter is increased.

In this embodiment, the inverter includes a first pair of transistors that are similar to a conventional inverter. These transistors include one NMOS transistor and one PMOS transistor. The gates of these transistors are tied to the input of the inverter, and the source of the NMOS transistor and drain of the PMOS transistor are tied to the output of the inverter. In a conventional inverter, the source of the PMOS transistor would be tied to Vdd, and the drain of the NMOS transistor would be tied to ground. In this embodiment, however, a first selectable current path is placed between the PMOS transistor and Vdd, and a second selectable current path is placed between the NMOS transistor and ground.

In one embodiment, each of the selectable current paths consists of a transistor that is always switched on and one or more additional transistors that are selectively switched on or off based upon the state of the signals on the neighboring lines. If the buffer is coupled to a single neighboring line, there is a single additional transistor. If the buffer is coupled to a pair of neighboring lines, there are two additional transistors. In the one embodiment, the first selectable current path consists of a set of PMOS transistors. The first transistor has its gate tied to ground, and the gates of the additional transistors are tied to the respective signal lines. The second selectable current path consists on a set of NMOS transistors, of which the first has its gate tied to Vdd, and the others have their gates tied to the respective signal lines. When the additional transistors are switched on, they allow more current flow through the selectable current path, and when they are switched off, they allow less current to flow through the selectable current path. A delay element is inserted between the signal lines into the gates of the respective transistors in order to prevent the transistors from being switched on or off during a signal transition in the buffer.

When a signal at the input of a buffer in a neighboring line is high, this signal may be hostile to a low-to-high transition at the input (high-to-low transition at the output) of the present buffer. The high signal of the neighboring line is applied to the additional transistors, selecting a high-current path to ground and thereby making the inverter more drivable in that direction. At the same time, a low-current path to Vdd is selected so that the inverter is less drivable in the opposite direction (which is desirable because the neighboring signal would be friendly to a high-to-low transition at the input, ie, low-to-high transition at the output, of the present buffer.)

Figure 2:
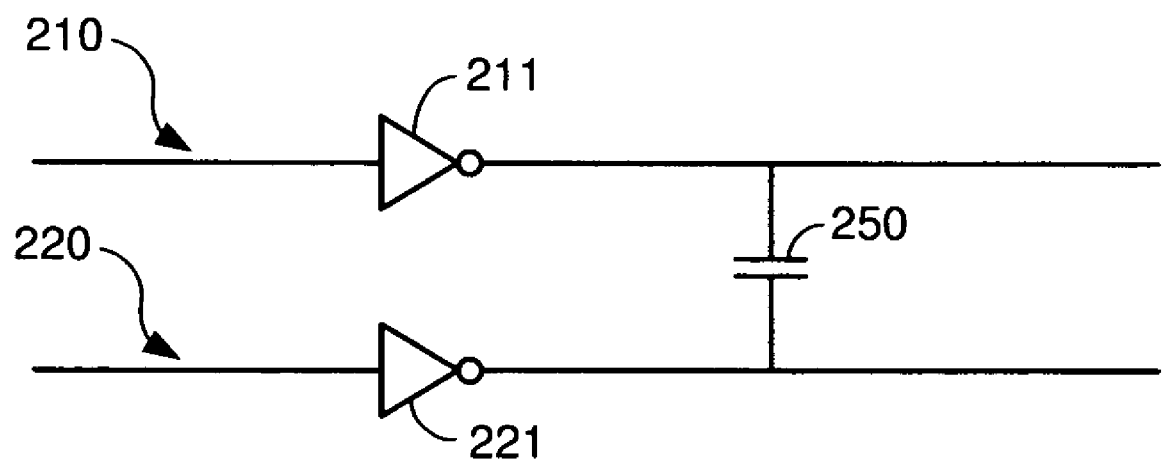
FIG. 2 is a diagram illustrating two signal lines having corresponding buffers and a virtual capacitor representative of the coupling capacitance between the lines.

Before describing the various embodiments of the invention, it may be helpful to describe in more detail the problem which is intended to be solved. Referring to FIG. 2, a diagram illustrating two signal lines in accordance with the prior art is shown. Each of signal lines 210 and 220 has a corresponding buffer (in this case, an inverter) 211 and 221. Also shown in FIG. 2 is a capacitor, 250. This capacitor is not a physical component of the signal lines, but is simply depicted to represent to the coupling capacitance between the signal lines. Signals are received at the left end of each signal line, inverted by the respective inverter, and provided at the right end of the signal line.

The discussion of the behavior of the signal lines shown in FIG. 2 will focus on line 220 and the effects of signals present on the neighboring line (210.) It should be noted that the signals on other lines will be similarly affected. For instance, the signals on line 210 will be affected by the signals on line 220, as well as another line that may be adjacent on the opposite side of line 210 (not shown.) For the sake of simplicity, however, only effects on one of the lines (line 220) will be discussed in detail. Similarly, in the discussions of the various embodiments of the invention, only one of the signal lines will be discussed, but it is understood that the discussion applies to other lines as well.

Figure 3A:
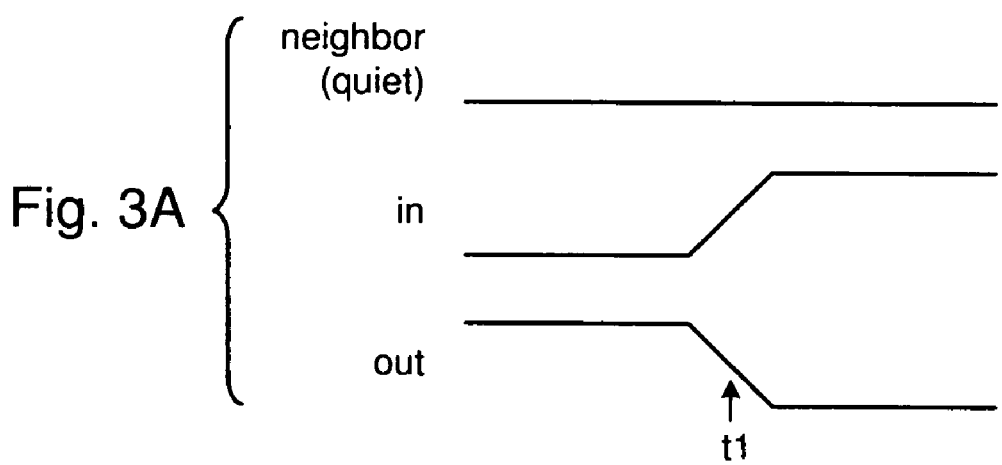
FIGS. 3A–3C are a set of diagrams illustrating signals that are input to and output from the signal lines shown in FIG. 2.
Figure 3B:
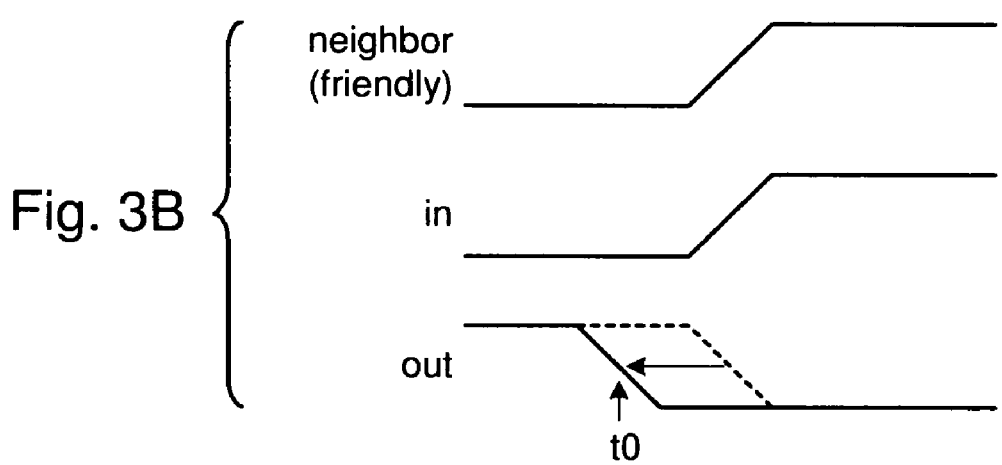
Figure 3C:
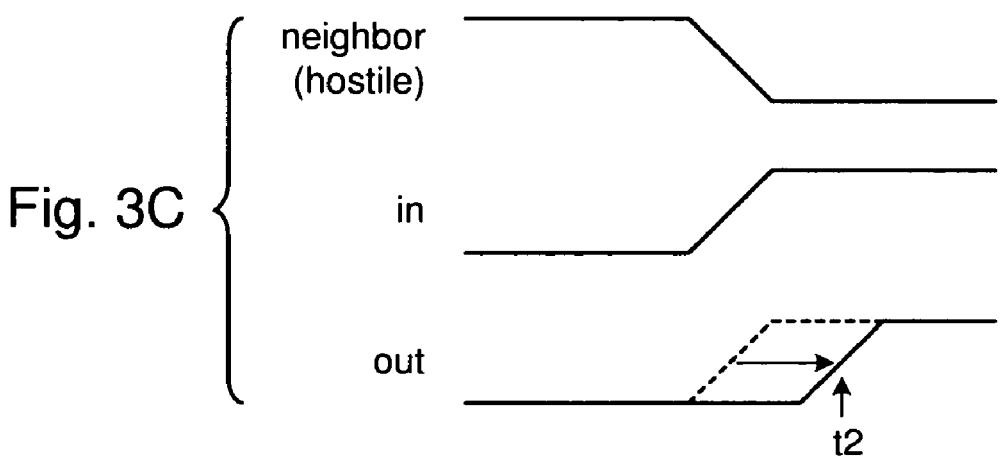

Referring to FIG. 3, a set of diagrams illustrating signals that are input to signal lines 210 and 220 and output from line 220 are shown. The signal input to line 220 is identified as "in," while the input to line 210 is identified as "neighbor." The output of line 220 is identified as "out." FIG. 3A shows a transition (from low to high) on line 220, while the signal on line 210 is quiet (i.e., there are no transitions.) FIG. 3B shows a low-to-high transition on line 220, and a "friendly" transition on line 210 (i.e., the signal on this line transitions from low to high, in the same way as the signal on line 220.) FIG. 3C shows a low-to-high transition on line 220 and a "hostile" transition on line 210 (i.e., the signal on this line transitions from high to low—the opposite of the signal on line 220.)

Referring to FIG. 3A, the low-to-high transition received at the left side of signal line 220 is inverted by inverter 221, producing a high-to-low transition at the right side of the signal line. The low signal received at the left side of line 210 is inverted to produce a high signal at the right side of this signal line. Because the signal on line 210 is quiet, it does not affect the timing of the high-to-low transition produced at the right side of signal line 220. The time at which this transition occurs is identified as t1 in FIG. 3A.

Referring to FIG. 3B, signal line 220 again receives a signal that has a low-to-high transition. The signal on line 210 also has a low-to-high transition simultaneous with the transition on line 220. When each of the signals is received by the inverter of the respective signal line, the signal at the right side of each line is pulled from high to low. As the signal on line 210 is pulled low, it reinforces the action of inverter 221 as it pulls the signal at the right side of line 220 low. This constructive interference causes the output of inverter 221 to be pulled low more quickly than if the signal on line 210 was quiet. The transition at the output of inverter 221 therefore occurs at time t0, rather than at time t1 (which is indicated by the dotted line.)

Referring to FIG. 3C, signal line 220 again receives a low-to-high transition at the input of inverter 221. The signal on line 210, however, has a high-to-low transition when the signal on line 220 transitions from low to high. Thus, as inverter 221 tries to pull the signal at the output of the inverter from high to low, inverter 211 is pulling the signal at its output from low to high. The interference of signal line 210 with line 220 is therefore destructive, rather than constructive. This causes the output of inverter 221 to be pulled low more slowly than if the signal on line 210 was quiet. The transition at the output of inverter 221 therefore occurs at time t2, rather than at time t1 (which is indicated by the dotted line in this figure.)

Figure 4:
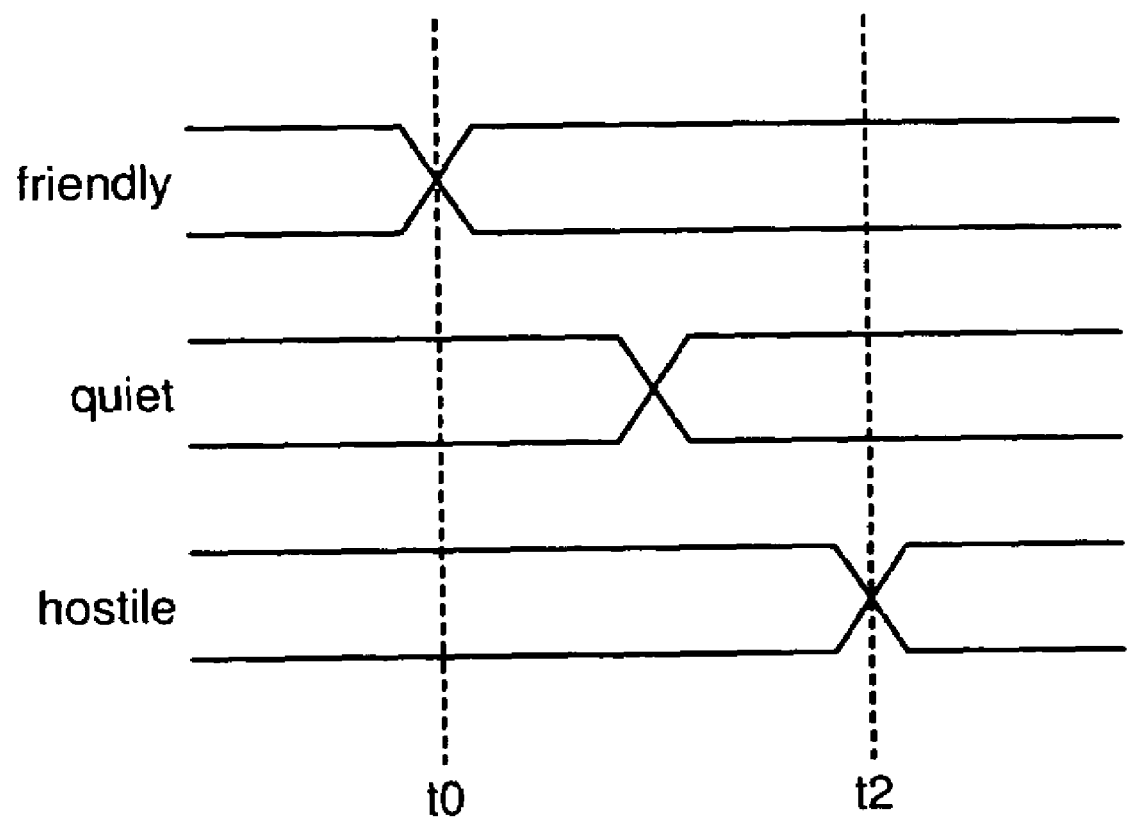
FIG. 4 is a diagram illustrating the timing variation on a signal line caused by interference from a neighboring signal line.

Referring to FIG. 4, a diagram illustrating the timing variation caused by the interference of the adjacent signal line is shown. In this figure, the three scenarios described above are depicted side-by-side to show that there is a large timing window during which the transition on line 220 may occur, depending upon the signal on line 210. If the signal on the neighboring line is quiet, the transition will occur at around t1. If the signal on the neighboring line is friendly, the transition may occur as early as t0. If the signal on the neighboring line is hostile, the transition may occur as late as t2. Thus, the system must accommodate a timing window that extends from t0 to t2. If this large timing window is accommodated, the system may not be able to achieve as high an operating speed as if the timing window were smaller.

The behavior described above assumes that the buffer (inverter) on signal line 220 maintains the same drivability, regardless of whether the neighboring signal line is friendly or hostile. The present embodiments, however, adjust the drivability of the buffer to compensate for the effects of interference from the neighboring line. By making the buffer less drivable when the action of the buffer is reinforced by constructive interference or by making the buffer more drivable when the action of the buffer is reduced by destructive interference, the timing window (between t0 and t2) can be reduced. When this timing window is smaller, the timing of the system does not have to be as tolerant of timing variations, and the system can achieve greater speed and performance.

Figure 5:
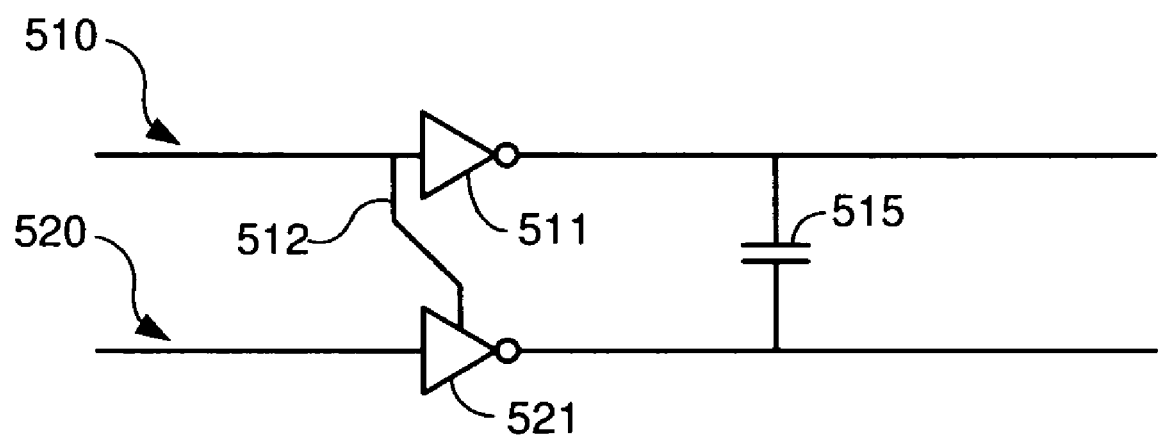
FIG. 5 is a diagram illustrating the configuration of a pair of signal lines in accordance with one embodiment.

Referring to FIG. 5, a diagram illustrating the configuration of a pair of signal lines in accordance with one embodiment is shown. In this figure, there are two signal lines, 510 and 520, each of which has a corresponding buffer (inverter,) 511 and 521. Capacitor 515 is not a separate component of the signal lines, but is included to represent the inherent coupling capacitance between the lines. A wire 512 couples a control input of inverter 521 to the input of inverter 511.

Figure 6:
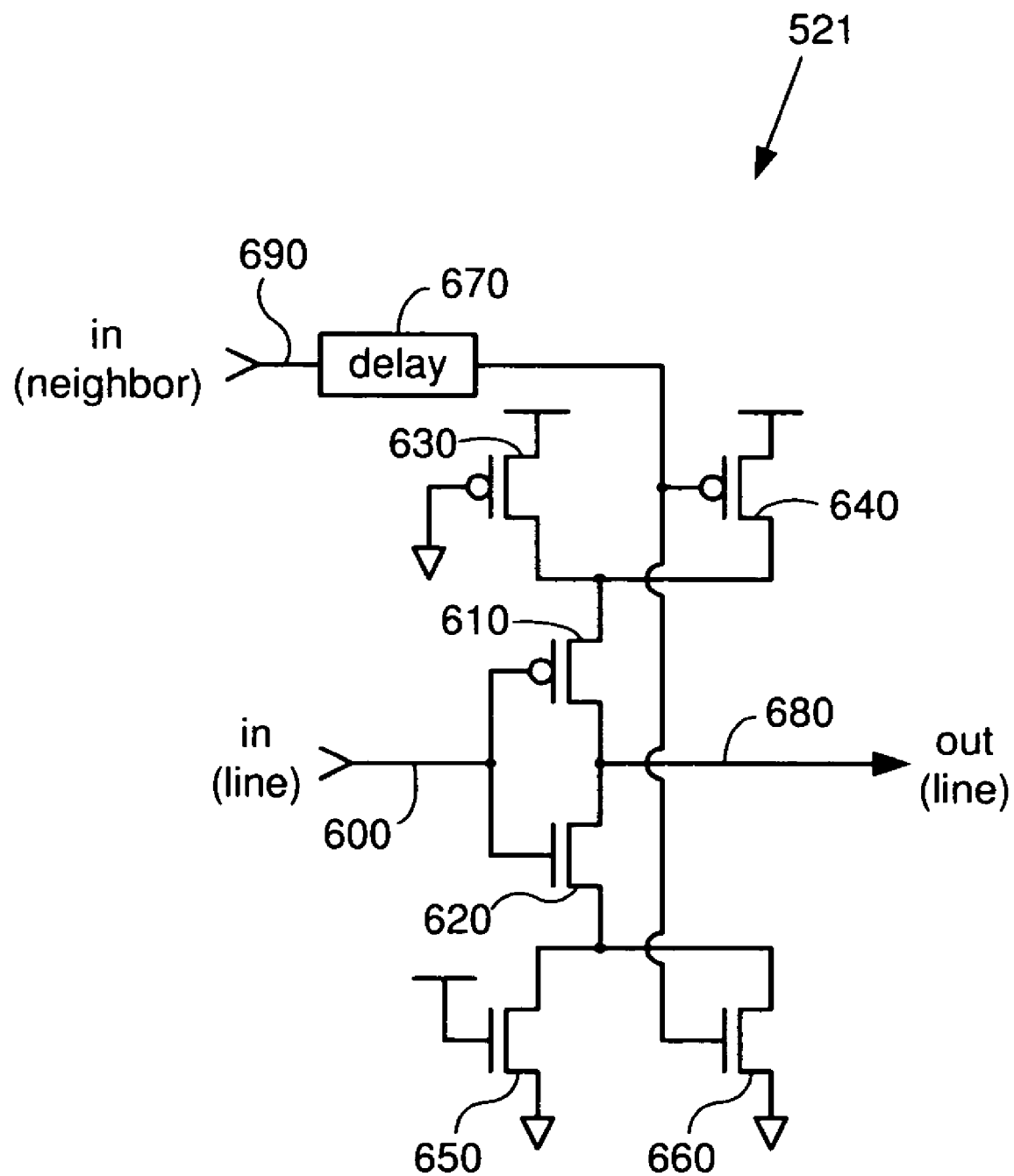
FIG. 6 is a diagram illustrating the structure of an inverter in accordance with one embodiment.

Referring to FIG. 6, a diagram illustrating the structure of inverter 521 in accordance with one embodiment is shown. Inverter 521 consists of six interconnected transistors and a delay element. Transistors 610 and 620 form the basic structure of the inverter. The gates of transistors 610 and 620 are tied together at input 600 of the inverter. The drain of transistor 610 is tied to the source of transistor 620 at output 680 of the inverter. In an ordinary inverter, the source of transistor 610 would be tied directly to Vdd, and the drain of transistor 620 would be tied directly to ground. In the present embodiment, however, transistors 610 and 620 are coupled to Vdd and ground, respectively, through transistors 630, 640, 650 and 660.

Transistor 620 is coupled to ground through transistors 650 and 660. Specifically, the drain of transistor 620 is tied to the sources of both transistor 650 and transistor 660. The drains of transistors 650 and 660 are tied directly to ground. The gate of transistor 650 is tied to Vdd, while the gate of transistor 660 is tied to the output of delay element 670. As will be explained in more detail below, transistors 650 and 660 selectively couple output 680 to ground, and may therefore be referred to herein as pull-down transistors.

Transistor 610 is coupled to Vdd through transistors 630 and 640. The source of transistor 610 is tied to the drains of transistors 630 and 640. The sources of transistors 630 and 640 are both tied to Vdd. The gate of transistor 630 is tied to ground, while the gate of transistor 640 is tied to the output of delay element 670 (and to the gate of transistor 660.) As will be explained below, transistors 630 and 640 selectively couple output 680 to Vdd, and may therefore be referred to herein as pull-up transistors.

As noted above, the gate of transistor 630 is tied to ground. Because transistor 630 is a PMOS transistor, it is switched on when the gate voltage is low. As a result, transistor 630 is always switched on. Even though transistor 630 does not transition between being switched on and being switched off, it still serves a useful purpose in that it regulates the flow of current from Vdd to output 680 of the inverter when transistor 610 is switched on. Similarly, NMOS transistor 650 (the gate of which is tied to Vdd so that the transistor is always switched on) regulates the flow of current from output 680 of the inverter to ground when transistor 620 is switched on.

The purpose of PMOS transistor 640 is to allow additional current to flow from Vdd to output 680 of the inverter when transistor 610 is switched on and when the signal on the neighboring line is either hostile or quiet. This reinforces the action of the inverter in pulling the signal on output line 680 high when the signal on input line 600 transitions from high to low. In other words, the drivability of the inverter is increased in this situation. Likewise, the purpose of NMOS transistor 660 is to allow additional current to flow from output 680 of the inverter to ground when transistor 620 is switched on and when the signal on the neighboring line is either hostile or quiet. This additional current reinforces the action of the inverter in pulling the signal on output line 680 low when the signal on input line 600 transitions from low to high. Transistors 640 and 660 thereby provide a selectable current path that allows either more or less current to flow to/from output 680, depending upon the potentially friendly or hostile state of the signal on the neighboring line.

The inverter illustrated in FIG. 6 operates the following manner. First, when only transistors 610, 620, 630 and 650 are considered, the inverter operates in just the same way as a conventional inverter. When the signal on input line 600 is low, transistor 620 is switched off, decoupling output line 680 from ground, and transistors 610 is switched on, coupling output line 680 to Vdd. (As noted above, transistors 630 and 650 are always switched on.) When the signal on input line 600 is high, transistor 610 is switched off, decoupling output line 680 from Vdd, and transistor 620 is switched on, coupling output line 680 to ground. When the signal on input line 600 transitions from low to high, the signal on output line 680 is pulled down as current flows through transistor 650, and when input line 600 transitions from high to low, the signal on output line 680 is pulled up by current flowing through transistor 630.

As noted above, the drivability of the inverter should be increased when the signal on the neighboring line is hostile, and should not be increased when the signal on the neighboring line is friendly. In order for the signal on the neighboring line to the hostile, the signal must initially have a value which is the opposite of the signal on the line being considered. Thus, if the line under consideration is currently low, the signal on the neighboring line can only be hostile if it is currently high. If this is the case, the signal on the neighboring line can transition from high to low when the signal on the line under consideration transitions from low to high. Similarly, if the signal on the line under consideration is currently high, the signal on the neighboring line must currently be low in order to be hostile.

It should be noted that, if the signal on the neighboring line is the opposite of the signal on the line under consideration, the signal on the neighboring line will not necessarily be hostile. If the signal on the neighboring line does not transition, it is "quiet," and will not affect the timing of the signal on the line under consideration. Similarly, a signal on the neighboring line that is the same as the signal on the line into consideration may remain quiet instead of experiencing a friendly transition.

The inverter of FIG. 6 experiences increased drivability when the signal on the neighboring line has the opposite value of the signal on input line 600. Consider the case in which the signal on the neighboring line is high. In this case, transistor 640 will be switched off and transistor 660 will be switched on. Thus, there will be one transistor (630) coupling the source of transistor 610 to Vdd, and two transistors (650 and 660) coupling the drain of transistor 620 to ground. As a result, the drivability of the inverter will be increased if the signal on output line 680 is being pulled down (i.e., the signal on input line 600 is transitioning from low to high,) but will be unaffected if the signal on output line 680 is being pulled up (i.e., the signal on input line 600 is transitioning from high to low.)

When the signal on the neighboring line is low, the polarities are simply reversed. In this instance, transistor 640 will be switched on and transistor 660 will be switched off. Consequently, transistor 620 will be coupled to ground through only a single transistor (650,) while transistor 610 will be coupled to Vdd through a pair of transistors (630 and 640.) The inverter will therefore experience increased drivability when the signal on output line 680 is being pulled up (when the signal on input line 600 goes from high to low,) and will experience normal drivability when the signal on output line 680 is the pulled down (when the signal on input line 600 goes from low to high.)

As pointed out above, the signal on the input of the neighboring line (690) is provided to the gates of transistor 640 and 660 by delay element 670. Delay element 670 may be any suitable component, such as a pair of serially connected inverters. The purpose of delay element 670 is to apply the initial signal value on the neighboring line to these transistors. If the signal were not delayed, the additional transistors (640 or 660) would remain switched on, increasing the drivability of the inverter only if the signal on the neighboring line were quiet. If the signal on the neighboring line made a hostile transition, the additional transistors would be initially switched on, but would be switched off when they were actually needed to reinforce the action of the inverter.

Figure 7:
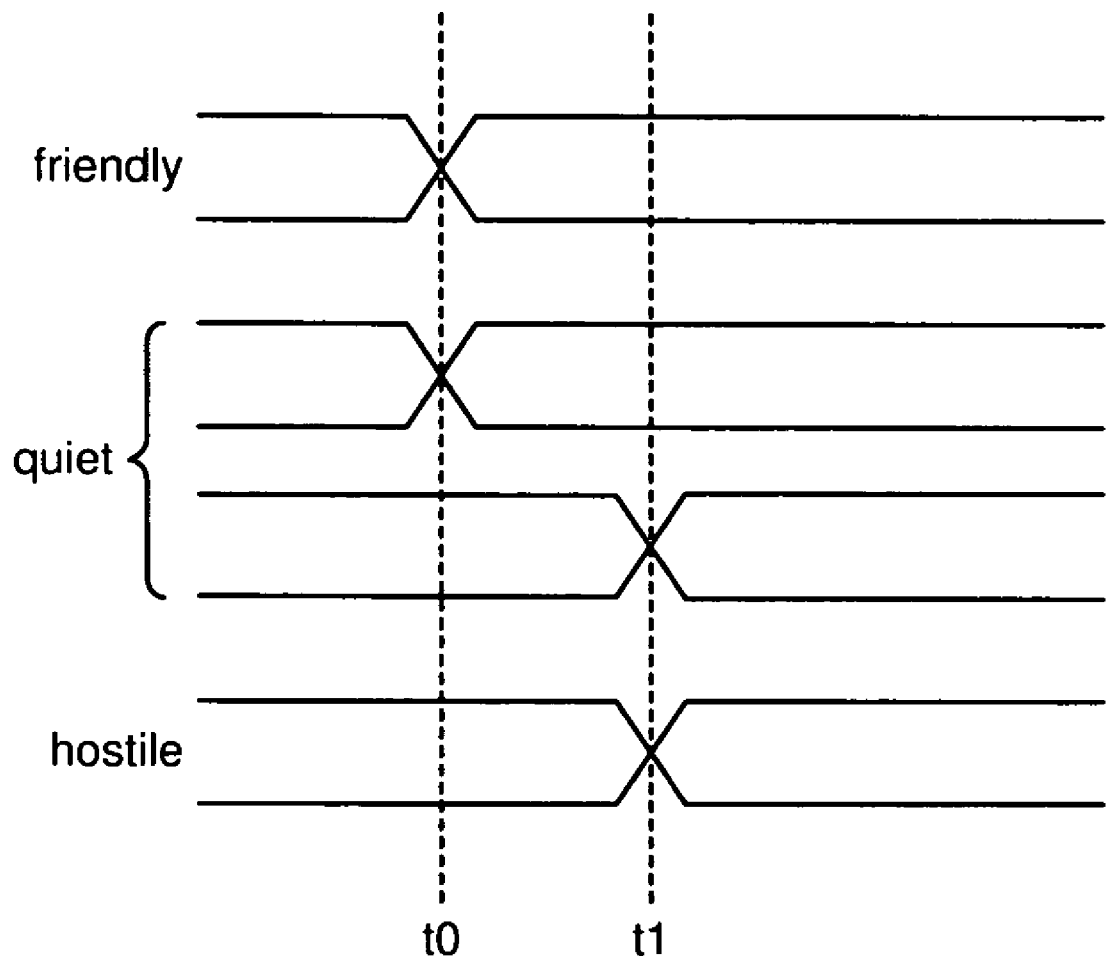
FIG. 7 is a diagram illustrating timing variations caused by interference from a signal line using a buffer in accordance with one embodiment.

Referring to FIG. 7, a diagram illustrating timing variations caused by interference from a signal line using a buffer in accordance with one embodiment is shown. This figure is similar to FIG. 4 in that it illustrates the timing differences when the signal on a neighboring line is either friendly, quiet or hostile. In the scenario in which the signal on the neighboring line is friendly, there is no change. The transition on the signal line still occurs at time t0. In the scenario in which the signal on the neighboring line is hostile, however, the increased drivability of the inverter causes the transition to occur at time t1, rather than at time t2, as was the case when the drivability of the inverter did not change.

In the event that the signal on the neighboring line is quiet, there are two possibilities. First, the inverter may anticipate that the signal will be friendly (i.e., the initial signal on the neighboring line is the same as the initial signal on the line under consideration,) in which case the drivability of the inverter will not be affected, and the transition will occur at time t1. Alternatively, the inverter may anticipate that the signal will be hostile (i.e., the initial signal on the neighboring line is the opposite of the initial signal on the line under consideration,) in which case the drivability of the inverter will be increased, and the transition will occur at time t0. Although the adjustable drivability of the inverter causes some of the transitions in the quiet scenario to occur before they would in the absence of any interference, it should be noted that the range of transition times for all of the scenarios has been confined to a smaller window than was previously the case, as shown in FIG. 4.

It should be noted that the timing variations depicted in FIGS. 4 and 7 are intended to be illustrative of the timing variations and the effect of modifying the drivability of the signal line buffers. These figures are not intended to imply that the timing variations in a given implementation will be exactly as shown, or that the increased drivability of the buffers will exactly cancel out the delays caused by hostile interference. The designs of various embodiments may affect the timing in ways that are specific to those embodiments.

Figure 8:
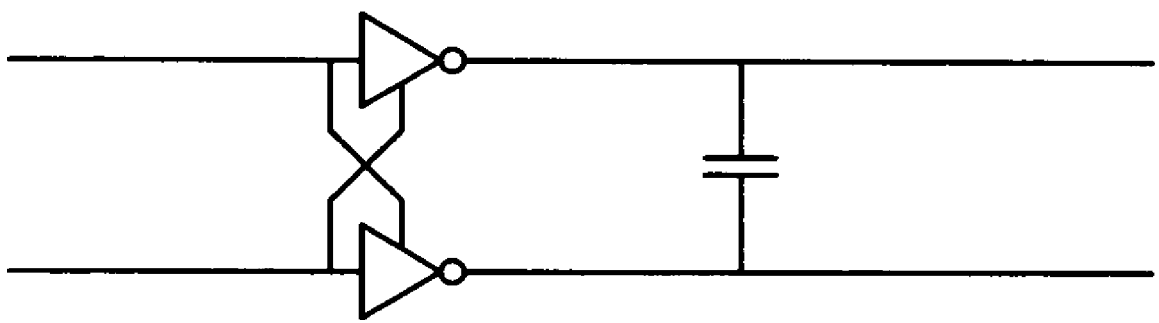
FIG. 8 is a diagram illustrating an alternative configuration in which the buffers of two adjacent signal lines are cross-coupled in accordance with one embodiment.
Figure 9:
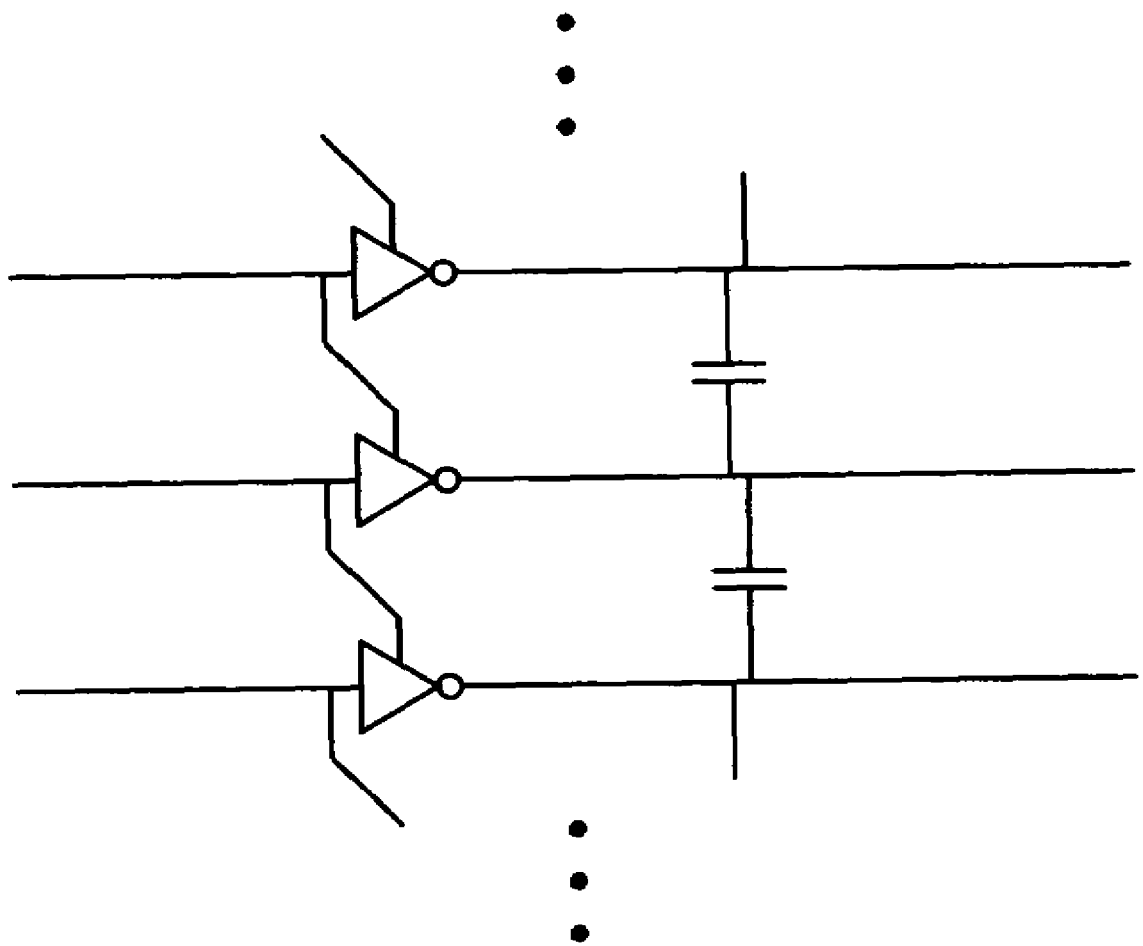
FIG. 9 is a diagram illustrating an alternative configuration in which there are three or more signal lines, each of which has an adjustably drivable buffer.

FIG. 5 illustrates a configuration in which there are two adjacent signal lines, but only a single one of the lines uses a buffer which has adjustable drivability. It should be noted that other configurations are possible. For example, FIG. 8 illustrates another configuration in which there are two adjacent signal lines, but the buffers of both lines are cross-coupled so that the drivability of each buffer is affected by whether or not the signal on the other line is hostile. Another configuration is illustrated in FIG. 9. In FIG. 9, there are three (or more) signal lines, each of which has an adjustable-drivability buffer.

In the event that there are three or more signal lines which are adjacent to each other, as shown in FIG. 9 for example, each signal line may be affected by interference from two adjacent lines, rather than one. It may therefore be desirable to provide an embodiment of the adjustable-drivability buffer that is controlled by input from both of the adjacent signal lines. An example of such an embodiment is illustrated in FIG. 10.

Figure 10:
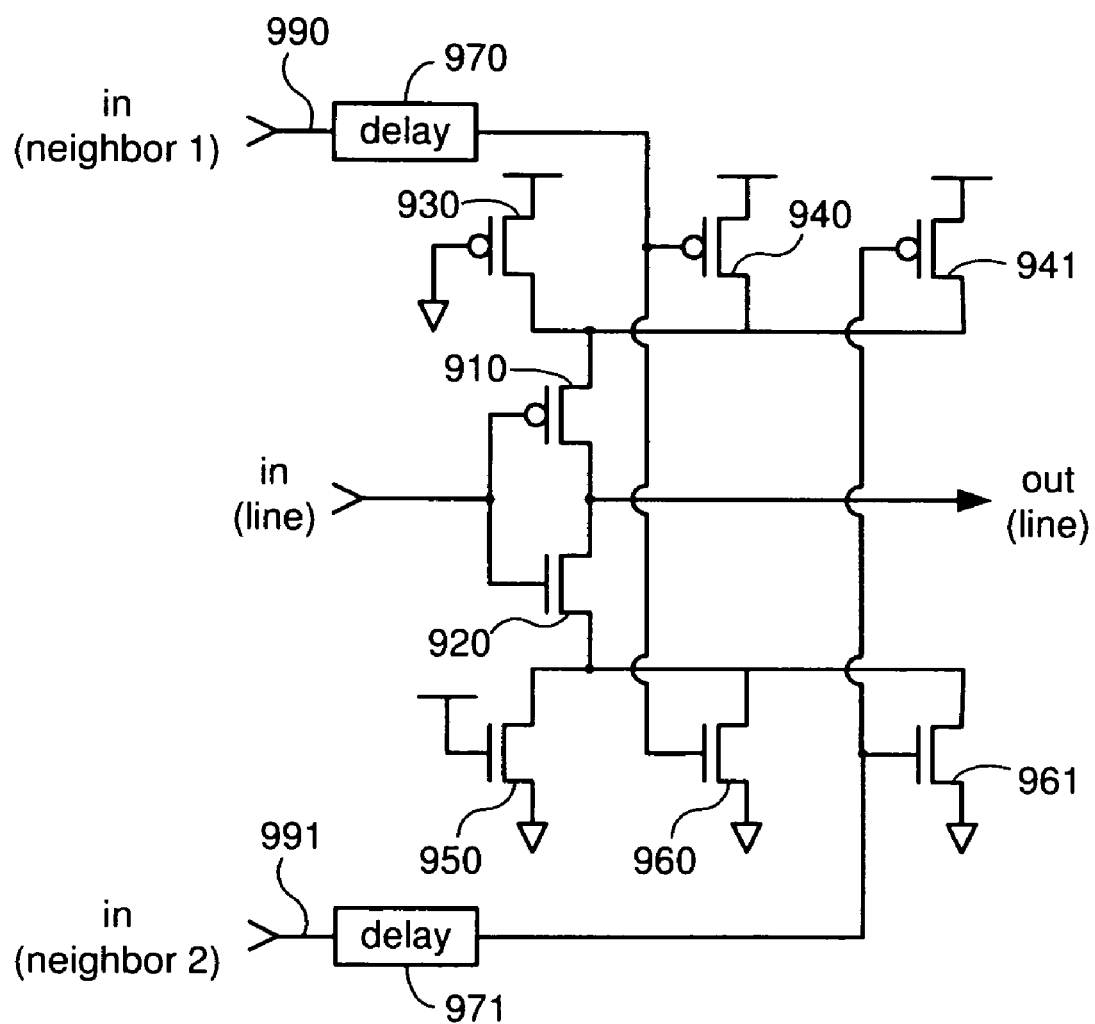
FIG. 10 is a diagram illustrating the structure of an inverter in accordance with an alternative embodiment.

Referring to FIG. 10, a diagram illustrating the structure of an inverter in accordance with an alternative embodiment is shown. This inverter consists of eight transistors and two delay elements. Transistors 910 and 920 alternately switch on and off to produce a signal at the output of the inverter which is the opposite of the signal at the input of the inverter. The source of transistor 910 is always coupled to Vdd through transistor 930, and is switchably coupled to Vdd through transistors 940 and 941. The drain of transistor 920 is always coupled to ground through transistor 950, and is switchably coupled to ground through transistors 960 and 961.

Transistors 940 and 960 are switched on and off according to the signal of a first neighboring signal line 990. Transistors 941 and 961 are switched on and off according to the signal of a second neighboring signal line 991. The signals from the first and second neighboring signal lines are delayed by delay elements 970 and 971, respectively. Each of these mechanisms (the first including transistors 940 and 960, and delay element 970, and the second including transistors 941 and 961, and delay element 971) operates in exactly the same way as the mechanism described in connection with FIG. 6 (i.e., transistors 640 and 660, and delay element 670.) Consequently, if there is a hostile (or potentially hostile) signal on one of the neighboring signal lines, one additional transistor couples the output line to either Vdd or ground, depending upon the direction of the signal transition. If there are hostile (or potentially hostile) signals on both of the neighboring signal lines, to additional transistors couple the output line to either Vdd or ground.

It should be noted that the various embodiments of the invention are not limited to lines which carry particular types of signals. The embodiments may be implemented in any type of signal lines in which signals on one line may interfere with signals on another line.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, and the like.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A buffer comprising:
    a signal input;
    a signal output;
    a first control input; and
    a delay element coupled to the first control input and configured to delay a control signal received at the first control input, wherein the control signal is received from an neighboring buffer;
    wherein the buffer is configured to selectively adjust the buffer's drivability in response to receiving the control signal at the first control input.

2. The buffer of claim 1, wherein the buffer is configured to adjust the buffer to a higher drivability when the control signal indicates that a signal on a neighboring signal line is potentially hostile.

3. The buffer of claim 1, wherein the buffer is configured to adjust the buffer to a lower drivability when the control signal indicates that a signal on a neighboring signal line is potentially friendly.

4. The buffer of claim 1, wherein the first control input is configured to receive the control signal from a neighboring signal line.

5. The buffer of claim 1, wherein the buffer comprises an inverter.

6. The buffer of claim 5, wherein the inverter comprises:
a first PMOS transistor;
a first NMOS transistor;
a first selectable current path;
a second selectable current path; and
a delay element;
wherein the gates of the first PMOS transistor and the first NMOS transistor are tied to the signal input, the source of the NMOS transistor and the drain of the PMOS transistor are tied to the signal output, the first selectable current path is coupled between the source of the PMOS transistor and Vdd, and the second selectable current path is coupled between the drain of the NMOS transistor and ground; and
wherein the delay element is configured to receive the control signal, delay the control signal, and provide the delayed control signal to the first and second selectable current paths, wherein the first and second selectable current paths are configured to select current paths based on the delayed control signal.

7. The buffer of claim 6, wherein the first selectable current path comprises a second PMOS transistor, wherein the source of the second PMOS transistor is tied to Vdd, the drain of the second PMOS transistor is tied to the source of the first PMOS transistor, and the gate of the second PMOS transistor is tied to the first control input, wherein the second selectable current path comprises a second NMOS transistor, and wherein the drain of the second NMOS transistor is tied to ground, the source of the second NMOS transistor is tied to the drain of the first NMOS transistor, and the gate of the second NMOS transistor is tied to the first control input.

8. The buffer of claim 7, further comprising a third PMOS transistor and a third NMOS transistor, wherein the source of the third PMOS transistor is tied to Vdd, the drain of the third PMOS transistor is tied to the source of the first PMOS transistor, and the gate of the third PMOS transistor is tied to ground, and wherein the drain of the third NMOS transistor is tied to ground, the source of the third NMOS transistor is tied to the drain of the first NMOS transistor, and the gate of the third NMOS transistor is tied to Vdd.

9. The buffer of claim 6, wherein the first selectable current path comprises second and third PMOS transistors, wherein the sources of the second and third PMOS transistors are tied to Vdd and the drains of the second and third PMOS transistors are tied to the source of the first PMOS transistor, wherein the second selectable current path comprises second and third NMOS transistors, wherein the drains of the second and third NMOS transistors are tied to ground and the sources of the second and third NMOS transistors are tied to the drain of the first NMOS transistor, and wherein the gates of the second PMOS and NMOS transistors are tied to the first control input and the gates of the third PMOS and NMOS transistors are tied to a second control input.

10. The buffer of claim 9, further comprising a fourth PMOS transistor and a fourth NMOS transistor, wherein the source of the fourth PMOS transistor is tied to Vdd, the drain of the fourth PMOS transistor is tied to the source of the first PMOS transistor, and the gate of the fourth PMOS transistor is tied to ground, and wherein the drain of the fourth NMOS transistor is tied to ground, the source of the fourth NMOS transistor is tied to the drain of the first NMOS transistor, and the gate of the fourth NMOS transistor is tied to Vdd.

11. A system comprising:
a first signal line having a first buffer; and
one or more neighboring signal lines;
wherein the first buffer has one or more control inputs, wherein each of the one or more control inputs is coupled to a corresponding one of the one or more neighboring signal lines, wherein each of the one or more control inputs has a delay element configured to delay signals of the one or more neighboring signal lines received at the one or more control inputs; and
wherein the first buffer is configured to selectively adjust the first buffer's drivability in response to receiving signals of the one or more additional signal lines at the one or more control inputs of the first buffer.

12. The system of claim 11, wherein when the signals of the one or more additional signal lines are potentially hostile to signal transitions on the first signal line, the first buffer is configured to set the drivability of the first buffer to a higher level and when the signals of the one or more additional signal lines are potentially friendly to signal transitions on the first signal line, the first buffer is configured to set the drivability of the first buffer to a lower level.

13. The system of claim 11, wherein each of the additional signal lines includes a corresponding second buffer, wherein the second buffer has one or more control inputs, wherein each of the one or more control inputs of the second buffer is coupled to a corresponding one of the first or additional signal lines, wherein the second buffer is configured to selectively adjust the second buffer's drivability in response to receiving control signals at the one or more control inputs of the second buffer.

14. A method comprising:
providing a buffer in a first signal line, wherein the buffer has adjustable drivability;
delaying one or more signals on one or more neighboring signal lines; and
adjusting the drivability of the buffer in response to whether the one or more signals on the one or more neighboring signal lines are potentially hostile or potentially friendly to signal transitions on the first signal line.

15. The method of claim 14, further comprising setting the drivability of the buffer to a higher level when a signal on a neighboring signal line is potentially hostile to signal transitions on the first signal line.

16. The method of claim 15, wherein signal on the neighboring signal line is potentially hostile to signal transitions on the first signal line when the signal on the neighboring signal is the opposite of a signal on the first signal line.

17. The method of claim 15, wherein setting the drivability of the buffer to a higher level comprises allowing an increased amount of current to flow from voltage source to an output of the buffer.

18. The method of claim 14, further comprising setting the drivability of the buffer to a lower level when the signal on the neighboring signal line is potentially friendly to signal transitions on the first signal line.

19. The method of claim 18, wherein signal on the neighboring signal line is potentially friendly to signal transitions on the first signal line when the signal on the neighboring signal is the same as a signal on the first signal line.

20. The method of claim 18, wherein setting the drivability of the buffer to a lower level comprises allowing a reduced amount of current to flow from voltage source to an output of the buffer.

* * * * *